(12) United States Patent
Kim et al.

(10) Patent No.: US 12,501,685 B2
(45) Date of Patent: Dec. 16, 2025

(54) SEMICONDUCTOR DEVICE

(71) Applicant: Samsung Electronics Co., Ltd., Suwon-si (KR)

(72) Inventors: Yunjin Kim, Hwaseong-si (KR); Ki Ho Bae, Seoul (KR); Boun Yoon, Seoul (KR); Ilyoung Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 17/898,028

(22) Filed: Aug. 29, 2022

(65) Prior Publication Data

US 2023/0223454 A1 Jul. 13, 2023

(30) Foreign Application Priority Data

Jan. 13, 2022 (KR) .................. 10-2022-0005528

(51) Int. Cl.
| | | |
|---|---|---|
| *H10D 64/27* | (2025.01) | |
| *H10D 30/01* | (2025.01) | |
| *H10D 30/43* | (2025.01) | |
| *H10D 30/67* | (2025.01) | |
| *H10D 30/69* | (2025.01) | |
| *H10D 64/23* | (2025.01) | |
| *H10D 84/01* | (2025.01) | |
| *H10D 84/03* | (2025.01) | |
| *H10D 84/83* | (2025.01) | |

(52) U.S. Cl.
CPC .......... *H10D 64/519* (2025.01); *H10D 64/256* (2025.01); *H10D 64/258* (2025.01); *H10D 64/514* (2025.01)

(58) Field of Classification Search
CPC ............ H01L 29/4238; H01L 27/0207; H01L 21/823475; H10D 64/519; H10D 64/256; H10D 30/6757; H10D 30/797; H10D 30/014; H10D 30/43; H10D 30/6735
See application file for complete search history.

(56) References Cited

U.S. PATENT DOCUMENTS 7,282,451 B2   10/2007   Hong et al.
7,470,981 B2   12/2008   Egusa
(Continued)

FOREIGN PATENT DOCUMENTS

| KR | 1020030092520 A | 12/2003 |
|---|---|---|
| KR | 100850066 B1 | 8/2008 |
| KR | 100881484 B1 | 2/2009 |

*Primary Examiner* — Monica D Harrison
*Assistant Examiner* — Moataz Khalifa
(74) *Attorney, Agent, or Firm* — Muir Patent Law, PLLC

(57) ABSTRACT

A semiconductor device may include a substrate including a first cell region, a second cell region, and a dummy region between the first and second cell regions, and conductive patterns included in the first cell region, the second cell region, and the dummy region. A first pattern density, which is defined as a density of the conductive patterns of the first cell region, may be different from a second pattern density, which is defined as a density of the conductive patterns of the second cell region. A third pattern density, which is defined as a density of the conductive patterns of the dummy region, gradually changes in a region between the first cell region and the second cell region. A top surface of the substrate may be inclined at an angle, in the dummy region.

20 Claims, 9 Drawing Sheets

(56) References Cited

U.S. PATENT DOCUMENTS

| | | |
|---|---|---|
| 7,774,726 B2 | 8/2010 | White |
| 8,645,879 B2 | 2/2014 | Fang et al. |
| 8,667,433 B2 | 3/2014 | Fukuda |
| 9,997,464 B2 | 6/2018 | Hsieh et al. |
| 10,878,165 B2 | 12/2020 | Chang et al. |
| 2016/0071726 A1 | 3/2016 | Mizuno et al. |
| 2017/0287909 A1* | 10/2017 | Oh ........................ G06F 30/392 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0005528, filed on Jan. 13, 2022, in the Korean Intellectual Property Office, the entire contents of which are hereby incorporated by reference.

BACKGROUND OF THE INVENTION

The present disclosure relates to a semiconductor device, and in particular, to a semiconductor device including a dummy region, which is provided between cell regions having different pattern densities and has a gradually changing pattern density.

A semiconductor device includes an integrated circuit consisting of metal-oxide-semiconductor field-effect transistors (MOS-FETs). To meet an increasing demand for a semiconductor device with a small pattern size and a reduced design rule, the size of MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize semiconductor devices with high performance.

Meanwhile, a chemical mechanical polishing (CMP) process is performed during fabricating a semiconductor device, and in this case, failures, such as dishing or erosion, may be caused by a difference in selectivity between different films (i.e., layers) to slurry. Dishing is a phenomenon, in which a specific film between films of different kinds is deeply recessed in a wide pattern region, compared with that in a neighboring region. Erosion is a phenomenon, in which, between films of different kinds, a region with a high pattern density and a neighboring region therearound are sunken. These failures may result in a reduction of a cross section of an interconnection line and an increase of electrical resistance of the interconnection line, and thus, it is important to minimize these failures.

SUMMARY

An embodiment of the inventive concept provides a semiconductor device with improved electric and reliability characteristics.

According to an embodiment of the inventive concept, a semiconductor device may include substrate including a first cell region, a second cell region, and a dummy region between the first and second cell regions, and conductive patterns included in the first cell region, the second cell region, and the dummy region. A first pattern density, which is defined as a density of the conductive patterns of the first cell region, may be different from a second pattern density, which is defined as a density of the conductive patterns of the second cell region. A third pattern density, which is defined as a density of the conductive patterns of the dummy region, gradually changes between the first cell region and the second cell region. A top surface of the substrate may be inclined at an angle, in the dummy region.

According to an embodiment of the inventive concept, a semiconductor device may include a substrate and conductive patterns. The substrate may include a plurality of cell regions having different conductive pattern densities and a dummy region between the cell regions. A conductive pattern density of the dummy region gradually changes between the cell regions, and a height of the substrate gradually changes in the dummy region.

According to an embodiment of the inventive concept, a semiconductor device may include an active pattern extended in a first direction, on a substrate including a first cell region, a second cell region, and a dummy region between the first and second cell regions, a pair of source/drain patterns provided on the active pattern and spaced apart from each other in the first direction, a gate electrode provided between the source/drain patterns and extended in a second direction to cross the active pattern, the second direction crossing the first direction, an interlayer insulating layer covering the source/drain patterns and the gate electrode, and active contacts provided to penetrate the interlayer insulating layer and connect to the source/drain patterns, respectively. A first density, which is defined as a density of the active contacts of the first cell region, may be different from a second density, which is defined as a density of the active contacts of the second cell region. A third density, which is defined as a density of the active contacts of the dummy region, gradually changes between the first cell region and the second cell region. A top surface of the substrate may be inclined at an angle, in the dummy region.

DETAILED DESCRIPTION

Example embodiments of the inventive concepts will now be described more fully with reference to the accompanying drawings, in which example embodiments are shown.

Figure 1:
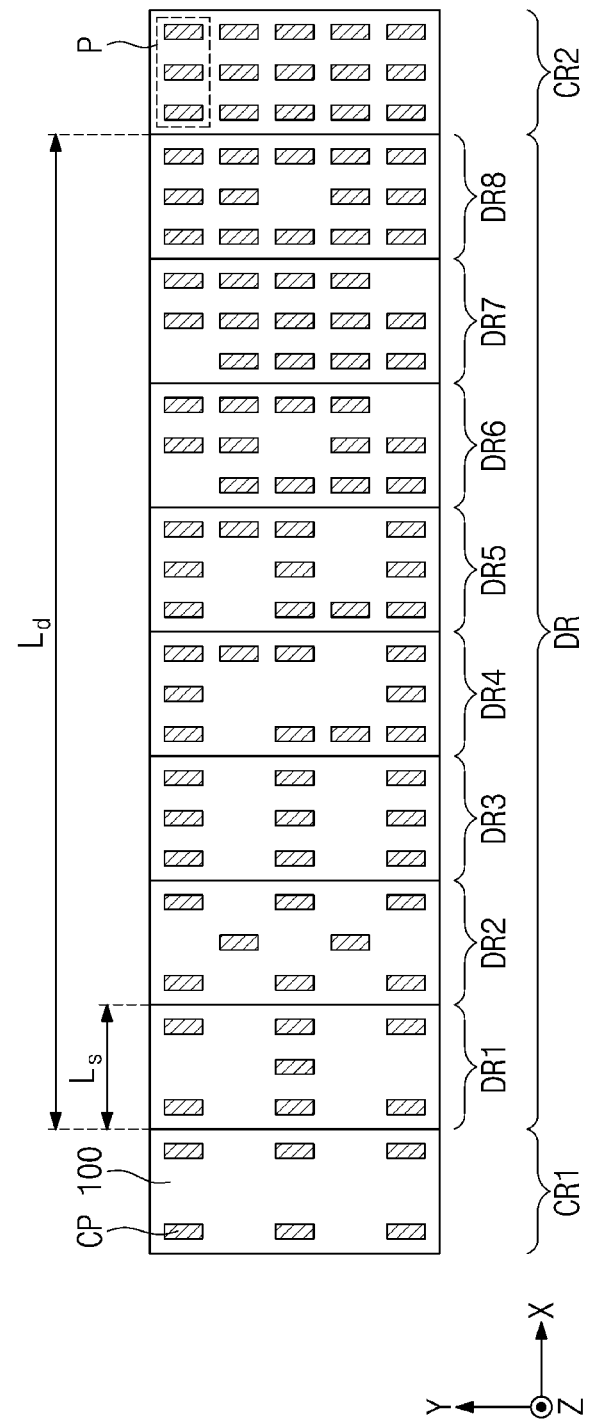
FIG. 1 is a plan view illustrating a semiconductor device according to an embodiment of the inventive concept.

FIG. 1 is a plan view illustrating a semiconductor device according to an embodiment of the inventive concept.

Referring to FIG. 1, a semiconductor device according to an embodiment of the inventive concept may include a substrate 100 and conductive patterns CP on the substrate 100. The substrate 100 may be a semiconductor substrate. For example, the substrate 100 may be a silicon substrate, a germanium substrate, or a silicon-germanium substrate.

The conductive patterns CP may be formed of or include at least one of conductive or metallic materials. In an embodiment, the conductive patterns CP may be patterns that are buried in the substrate 100. In an embodiment, the conductive patterns CP may be protruding patterns, which are extended from a top surface of the substrate 100 in a third direction Z and are covered with an interlayer insulating layer.

The substrate 100 may include a first cell region CR1, a second cell region CR2, and a dummy region DR between the first and second cell regions CR1 and CR2. The first and second cell regions CR1 and CR2 may be spaced apart from each other in a horizontal direction (e.g., a first direction X). The dummy region DR may include a plurality of sub-dummy regions DR1 to DR8. The sub-dummy regions DR1 to DR8 may have the same length of $L_s$ in the first direction X. The length $L_s$ of each of the sub-dummy regions DR1 to DR8 in the first direction X may be defined as a unit length. As used herein, the term "dummy" is used to refer to a component that has the same or similar structure and shape as other components but does not have a substantial function and exists only as a pattern in the device. For example, the conductive patterns in a dummy region may not be utilized in a functional operation of the semiconductor device.

FIG. 1 illustrates an example in which the number of the sub-dummy regions DR1 to DR8 is 8, but the inventive concept is not limited to this example. The number of the sub-dummy regions DR1 to DR8 may be changed depending on a distance $L_d$ between the first and second cell regions CR1 and CR2 and a unit length (i.e., the length $L_s$ of each of the sub-dummy regions DR1 to DR8 in the first direction X). For example, the number of the sub-dummy regions DR1 to DR8 may be given by a formula of $L_d/L_s$.

For example, the first sub-dummy region DR1 may be adjacent to the first cell region CR1, and the eighth sub-dummy region DR8 may be adjacent to the second cell region CR2. The first to eighth sub-dummy regions DR1 to DR8 may be arranged in the first direction X from the first cell region CR1 to the second cell region CR2.

A pattern density $d_1$ of the first cell region CR1 may be different from a pattern density $d_2$ of the second cell region CR2. The pattern density may be defined as the number of the conductive patterns CP per unit area of the substrate (e.g., cell region, dummy region, and sub-dummy region), and in the present specification, an average pattern density may mean an average pattern density of a plurality of regions. For example, the pattern density $d_2$ of the second cell region CR2 may be higher than the pattern density $d_1$ of the first cell region CR1. The pattern density of the first sub-dummy region DR1 in the dummy region DR may be higher than the pattern density $d_1$ of the first cell region CR1, and the pattern density of the eighth sub-dummy region DR8 may be lower than the pattern density $d_2$ of the second cell region CR2. The pattern density in the dummy region DR gradually increases in a direction from the first sub-dummy region DR1 toward the eighth sub-dummy region DR8.

As shown in FIG. 1, a length of each of the first and second cell regions CR1 and CR2 in the first direction X may be substantially equal to the length $L_s$ of each of the first to eighth sub-dummy regions DR1 to DR8 in the first direction X, and when six conductive patterns CP are provided in the first cell region CR1 and fifteen conductive patterns CP are provided in the second cell region CR2, 7 to 14 conductive patterns CP may be sequentially provided in the first to eighth sub-dummy regions DR1 to DR8. In each of the first to eighth sub-dummy regions DR1 to DR8, the conductive patterns CP may be arranged to be symmetric about a diagonal of a top surface of each of the first to eighth sub-dummy regions DR1 to DR8. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

A change rate $R_{12}$ in the pattern density between the first and second cell regions CR1 and CR2 may be given by the following formula 1.

$$R_{12}=(d_2-d_1)/(L_d/L_s+1)$$ [Formula 1]

The pattern density of the first sub-dummy region DR1 may be higher than the pattern density $d_1$ of the first cell region CR1 by the change rate $R_{12}$, and the pattern density of the eighth sub-dummy region DR8 may be lower than the pattern density $d_2$ of the second cell region CR2 by the change rate $R_{12}$. A difference in pattern density between two adjacent ones of the first to eighth sub-dummy regions DR1 to DR8 may be $R_{12}$. For example, given the example of FIG. 1., the change rate $R_{12}$ in the pattern density is 1.

Figure 2:
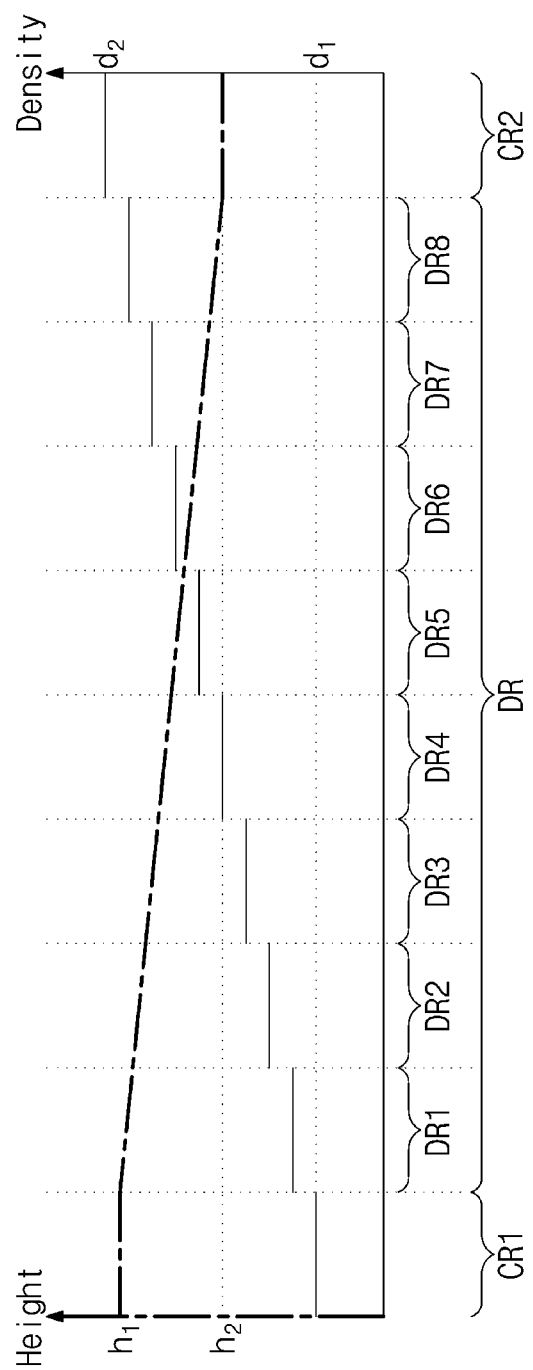
FIG. 2 is a graph showing a change in density and height of patterns in the semiconductor device of FIG. 1.

FIG. 2 is a graph showing a change in density and height of patterns in the semiconductor device of FIG. 1.

Referring to FIGS. 1 and 2, the pattern density of the dummy region DR may be increased in a stepwise (i.e., discontinuous) manner in a direction from the first sub-dummy region DR1 toward the eighth sub-dummy region DR8. In an embodiment, the pattern density of the dummy region DR may be continuously increased in the direction from the first sub-dummy region DR1 toward the eighth sub-dummy region DR8.

Given the difference in pattern density between two adjacent ones of the first to eighth sub-dummy regions DR1 to DR8 and as a result of a CMP process, a height $h_1$ of the first cell region CR1 may be larger than a height $h_2$ of the second cell region CR2. In the present specification, the height may mean a level measured from a top surface of the semiconductor device including the substrate 100 and the conductive patterns CP. The height of the dummy region DR gradually decreases in the direction from the first sub-dummy region DR1 toward the eighth sub-dummy region DR8. The height of the dummy region DR may be continuously decreased in the direction from the first sub-dummy region DR1 toward the eighth sub-dummy region DR8. That is, in the dummy region DR, the top surface of the semiconductor device may be inclined at an angle to a plane that is parallel to the first direction X and a second direction Y.

Since the pattern density of the dummy region DR gradually changes between the first and second cell regions CR1 and CR2, it may be possible to prevent or suppress an edge-of-erosion (EOE) phenomenon at boundaries between the first cell region CR1 and the dummy region DR and between the second cell region CR2 and the dummy region DR and thereby to improve electrical and reliability characteristics of the semiconductor device.

Figure 3:
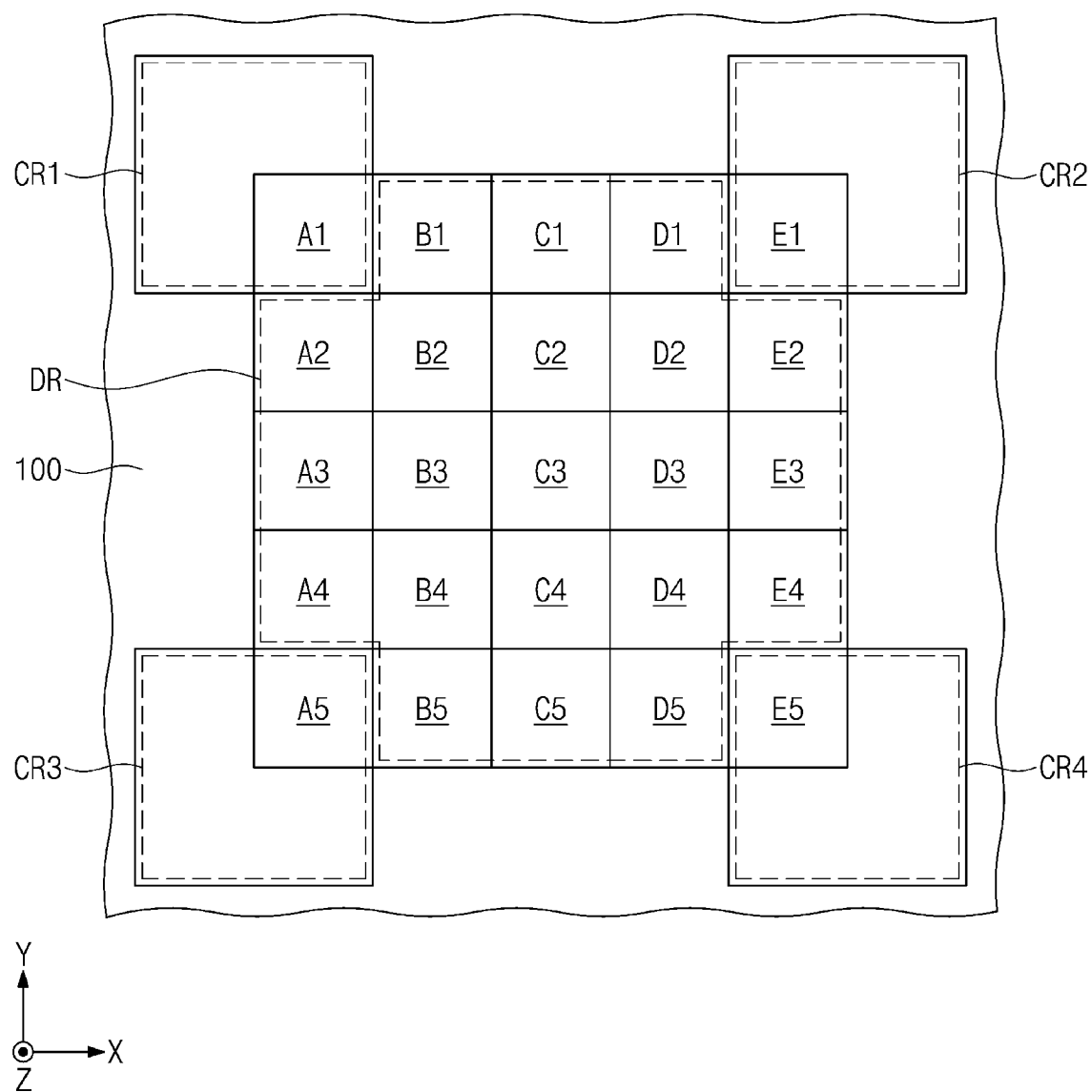
FIG. 3 is a plan view illustrating a semiconductor device according to an embodiment of the inventive concept.

FIG. 3 is a plan view illustrating a semiconductor device according to an embodiment of the inventive concept.

Referring to FIG. 3, the substrate 100 may include first to fourth cell regions CR1 to CR4. The first to fourth cell regions CR1 to CR4 may be spaced apart from each other in a horizontal direction. The first and second cell regions CR1 and CR2 may be spaced apart from each other in the first direction X. The third and fourth cell regions CR3 and CR4 may be spaced apart from each other in the first direction X. The first and third cell regions CR1 and CR3 may be spaced apart from each other in the second direction Y. The second and fourth cell regions CR2 and CR4 may be spaced apart from each other in the second direction Y.

A region of the substrate 100 may include sub-regions (e.g., regions A1 to A5, regions B1 to B5, regions C1 to C5, regions D1 to D5, and regions E1 to E5) that are sectioned to have substantially the same area. The region A1 may be located within the first cell region CR1, the region E1 may be located within the second cell region CR2, the region A5 may be located within the third cell region CR3, and the region E5 may be located within the fourth cell region CR4. The remaining ones of the sub-regions, except for the regions A1, E1, A5, and E5, may correspond to the dummy region DR.

The regions A1 to A5 may be arranged in the second direction Y. The regions B1 to B5 may be arranged in the second direction Y. The regions C1 to C5 may be arranged in the second direction Y. The regions D1 to D5 may be arranged in the second direction Y. The regions E1 to E5 may be arranged in the second direction Y. The region A1, the region B1, the region C1, the region D1, and the region E1 may be arranged in the first direction X. The region A2, the region B2, the region C2, the region D2, and the region E2 may be arranged in the first direction X. The region A3, the region B3, the region C3, the region D3, and the region E3 may be arranged in the first direction X. The region A4, the region B4, the region C4, the region D4, and the region E4 may be arranged in the first direction X. The region A5, the region B5, the region C5, the region D5, and the region E5 may be arranged in the first direction X. Although FIG. 3 illustrates an example in which three sub-regions are placed between two adjacent regions of the first to fourth cell regions CR1 to CR4, the inventive concept is not limited to this example.

The change rate in the pattern density between the first to fourth cell regions CR1 to CR4 may be expressed by the following formula 2.

$$R_{ij}=(d_j-d_i)/(n+1)(i,j=1, 2, 3 \text{ or } 4, i \neq j)$$ [Formula 2]

where $R_{ij}$ is a change rate in pattern density between i-th and j-th cell regions, $d_i$ is a pattern density of the i-th cell region, and n is the number of the sub-regions placed between two adjacent ones of the first to fourth cell regions CR1 to CR4.

A pattern density of each of the regions A1 to A5, E1 to E5, B1, C1, D1, B5, C5, and D5 may be determined by a pattern density of one cell region and a change rate of one pattern density. As an example, a pattern density $d_{C1}$ of the region C1 may be higher than a pattern density $d_{A1}$ of the region A1 (i.e., the pattern density $d_1$ of the first cell region CR1) by $2 \times R_{12}$ (i.e., $d_{C1}=d_1+2\times R_{12}$). As another example, a pattern density $d_{E4}$ of the region E4 may be lower than a pattern density $d_{E5}$ of the region E5 (i.e., a pattern density $d_4$ of the fourth cell region CR4) by $R_{24}$ (i.e., $d_{E4}=d_4-R_{24}$).

A pattern density of each of the regions B2 to B4, C2 to C4, and D2 to D4 may be determined in consideration of the pattern densities of the regions A1 to A5, E1 to E5, B1, C1, D1, B5, C5, and D5 and the change rates of the pattern density. As an example, a pattern density $d_{C3}$ of the region C3 may be given by the following formula 3.

$$d_{C3}=\{(d_1+2\times R_{14})+(d_{C1}+d_{C5})/2+(d_{A3}+d_{E3})/2+(d_2+2\times R_{23})\}/4$$ [Formula 3]

As another example, the pattern density $d_{D4}$ of the region D4 may be given by the following formula 4.

$$d_{D4}=\{(d_4-R_{14})+(d_{D1}+3\times d_{D5})/4+(d_{A4}+3\times d_{E4})/4+(d_{E3}+d_{C5})/2\}/4$$ [Formula 4]

In other words, the pattern density of each of the regions B2 to B4, C2 to C4, and D2 to D4 may be determined as a mean of values considering the change rate of the pattern density in the first direction X and the change rate of the pattern density in the second direction Y, and values considering the change rates of the pattern densities in diagonal directions inclined to the first and second directions X and Y.

As described above, the pattern density of each of the sub-regions between the first to fourth cell regions CR1 to CR4 may be determined such as the pattern density gradually changes between the first to fourth cell regions CR1 to CR4.

Figure 4:
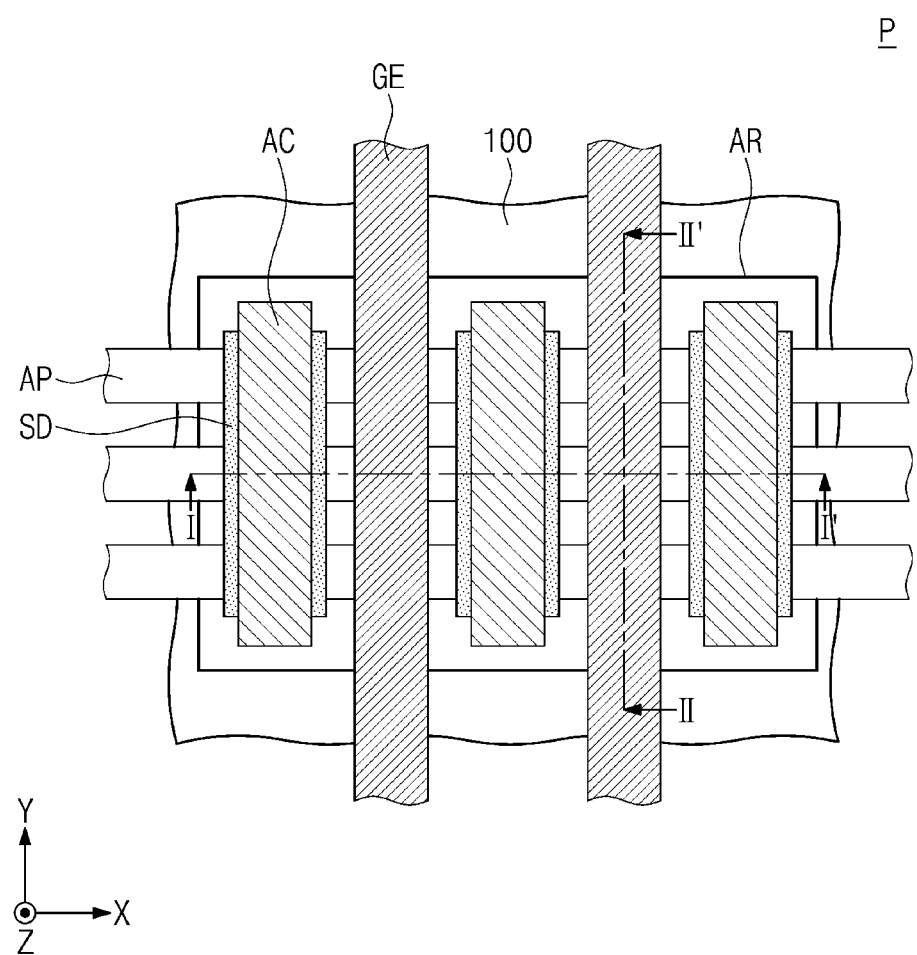
FIGS. 4 and 7 are plan views, each of which illustrates a semiconductor device according to an embodiment of the inventive concept and corresponds to a portion 'P' of FIG. 1.
Figure 5:
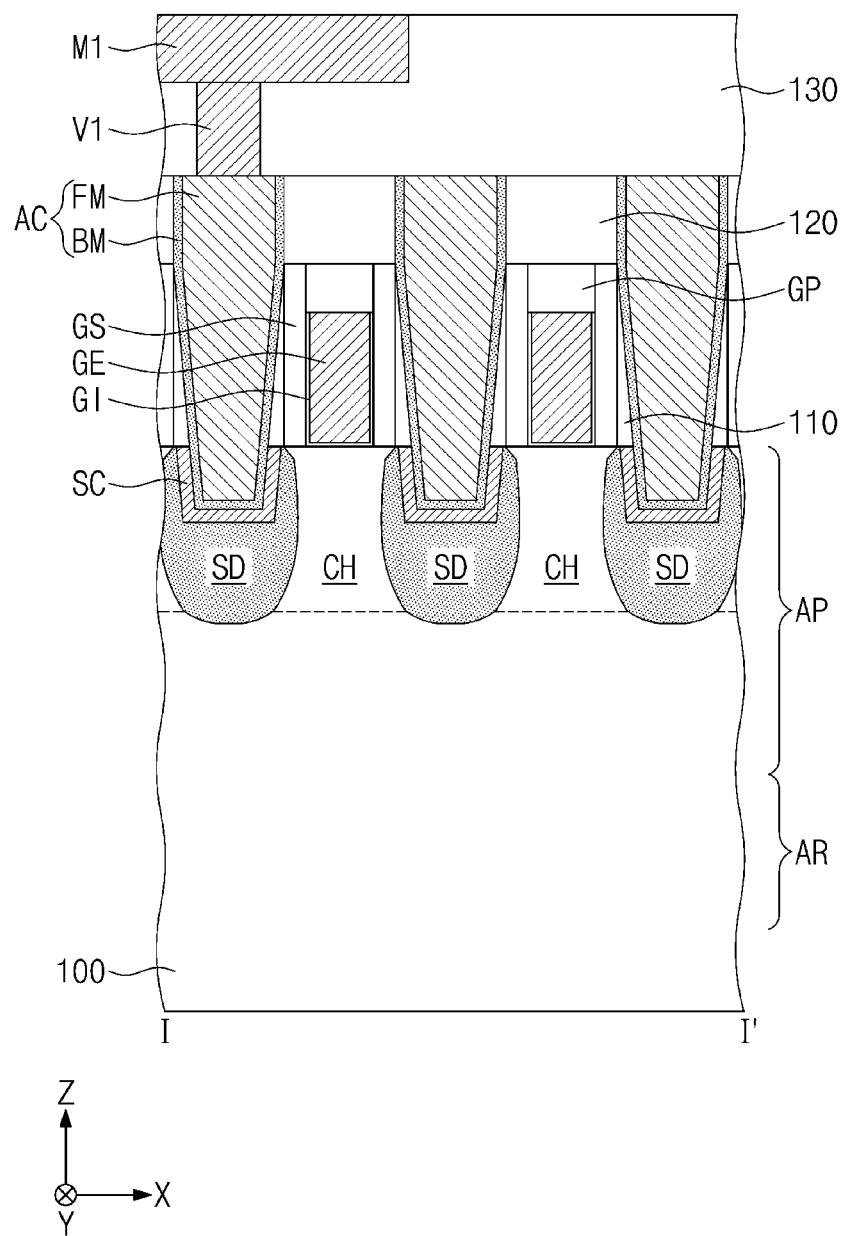
FIGS. 5 and 6 are sectional views, which are respectively taken along lines I-I' and II-II' of FIG. 4 to illustrate a semiconductor device according to an embodiment of the inventive concept.
Figure 6:
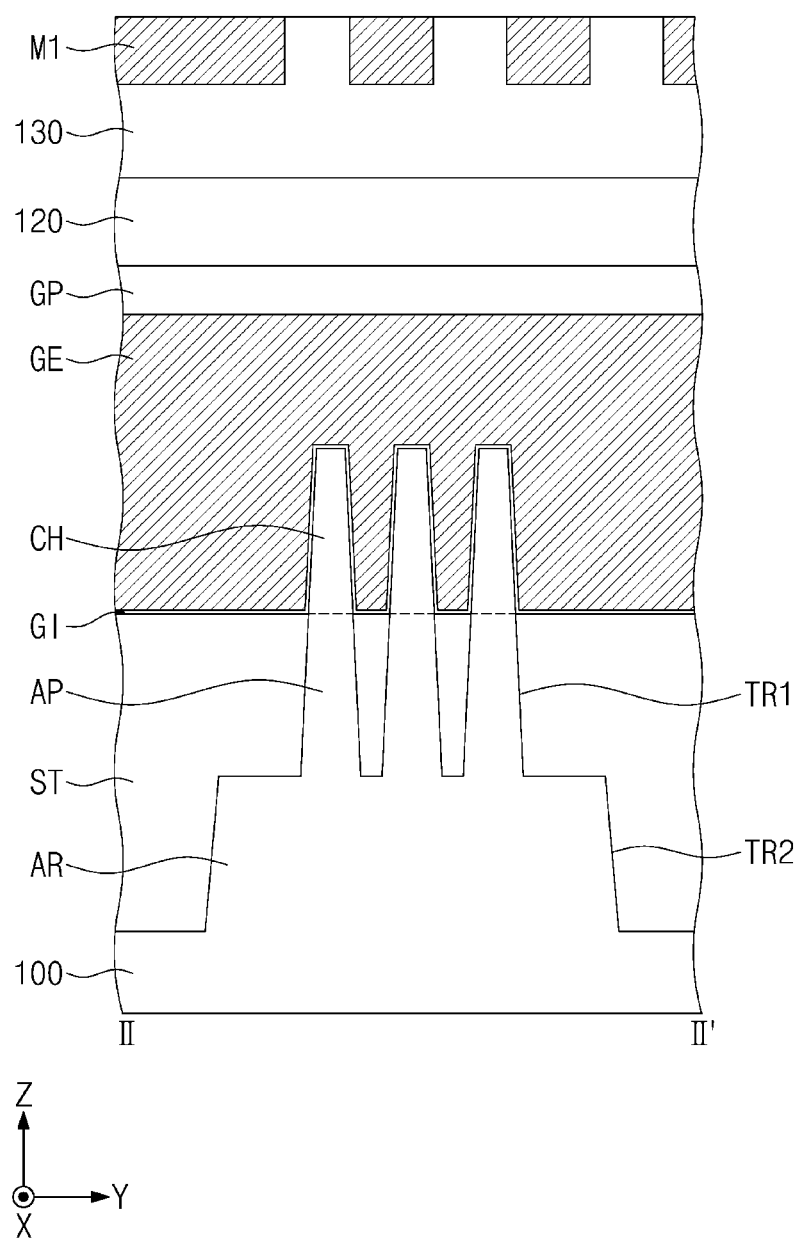

FIG. 4 is a plan view illustrating a semiconductor device according to an embodiment of the inventive concept and corresponding to a portion 'P' of FIG. 1. FIGS. 5 and 6 are sectional views, which are respectively taken along lines I-I' and II-II' of FIG. 4 to illustrate a semiconductor device according to an embodiment of the inventive concept.

Referring to FIGS. 4, 5, and 6, a further description of the substrate 100 may be provided. The substrate 100 may include a semiconductor substrate, which is formed of or includes one of silicon (Si), germanium (Ge), or silicon-germanium (SiGe), or a compound semiconductor substrate.

The active region AR may be defined by a second trench TR2 formed in an upper portion of the substrate 100. The active region AR may be a region, in which a standard cell constituting a logic circuit is provided. For example, the active region AR may be a region, in which a PMOS or NMOS field effect transistor is provided. In an embodiment, a plurality of active regions AR may be provided, and the second trench TR2 may be formed between the active regions AR. The active regions AR may be spaced apart from each other with the second trench TR2 interposed therebetween. Hereinafter, just one of the active regions AR will be described below, for brevity's sake, but the others may also have substantially the same features as those described below.

A plurality of active patterns AP may be defined by a first trench TR1 formed in an upper portion of the substrate 100. The active patterns AP may be provided on the active region AR. The first trench TR1 may be shallower than the second trench TR2. The active patterns AP may be extended in the first direction X and may be spaced apart from each other in the second direction Y. As a height in the third direction Z increases, a width of the active patterns AP in the second direction Y may decrease.

A device isolation layer ST may be provided to fill the first and second trenches TR1 and TR2. An upper portion of each of the active patterns AP may protrude above the device isolation layer ST in the third direction Z. The upper portion of each of the active patterns AP may have a fin shape, the fin-shaped portion may be referred to as a channel layer CH, which is placed between source/drain patterns SD to be described below. In other words, a transistor on the active region AR may be a fin field effect transistor (Fin-FET).

The device isolation layer ST may not cover the upper portion of each of the active patterns AP. The device isolation layer ST may partially cover a side surface of each of the active patterns AP. The device isolation layer ST may be formed of or include silicon oxide.

The source/drain patterns SD may be provided on the active patterns AP. The channel layer CH may be provided between a pair of the source/drain patterns SD. The source/drain patterns SD may be epitaxial patterns which are formed by a selective epitaxial growth process. In an embodiment, the source/drain patterns SD may be formed of or include a semiconductor material whose lattice constant is greater than that of the substrate 100. In this case, the source/drain patterns SD may exert a compressive stress on the channel layer CH. In an embodiment, the source/drain patterns SD may be formed of or include a semiconductor material that has the same lattice constant as the substrate 100.

A gate electrode GE may be provided to cross the active patterns AP or to extend in the second direction Y. As shown in FIG. 6, the gate electrode GE may be provided to cover or face top and side surfaces of the upper portion of each of the active patterns AP. In an embodiment, a plurality of gate electrodes GE may be provided on the active region AR. The gate electrodes GE on the active region AR may be spaced apart from each other in the first direction X. Hereinafter, just one of the gate electrodes GE will be described below, for brevity's sake, but the others may also have substantially the same features as those described below. The gate electrode GE may be formed of or include at least one of doped semiconductor materials, conductive metal nitride materials, and/or metallic materials. In an embodiment, the gate electrode GE may include a plurality of metal patterns that are different from each other. The metal patterns may have different electric resistances from each other. By adjusting a composition and/or thickness of each of the metal patterns, it may be possible to realize a transistor having a desired threshold voltage.

Gate spacers GS may be provided to cover opposite side surfaces of the gate electrode GE. Each of the gate spacers GS may be extended along the side surface of the gate electrode GE or in the second direction Y. Each of the gate spacers GS may be extended from a top surface of the channel layer CH in the third direction Z. A top surface of each of the gate spacers GS may be located at a level higher than a top surface of the gate electrode GE. The gate spacers GS may be formed of or include at least one of insulating nitride materials. For example, the gate spacers GS may be formed of or include at least one of SiCN, SiCON, or SiN. In an embodiment, the gate spacers GS may have a multi-layered structure; for example, the gate spacers GS may include layers that are formed of at least two different materials selected from the group consisting of SiCN, SiCON, and SiN.

A gate insulating pattern GI may be interposed between the gate electrode GE and the channel layer CH. The gate insulating pattern GI may be extended along a top surface of the device isolation layer ST. The gate insulating pattern GI may be extended into regions between the gate electrode GE and the gate spacers GS. The uppermost surface of the gate insulating pattern GI may be substantially coplanar with the uppermost surface of the gate electrode GE. The gate electrode GE may be spaced apart from the gate spacers GS with the gate insulating pattern GI interposed therebetween. The gate insulating pattern GI may be formed of or include at least one of, for example, silicon oxide, silicon nitride, silicon oxynitride, or high-k dielectric materials. The high-k dielectric materials may include materials (e.g., hafnium oxide (HfO), aluminum oxide (AlO), or tantalum oxide (TaO)) whose dielectric constants are higher than silicon oxide and silicon nitride.

A gate capping pattern GP may be provided on the gate electrode GE. The gate capping pattern GP may be extended along the top surface of the gate electrode GE or in the second direction Y. The gate capping pattern GP may have a top surface that is substantially coplanar with the top surface of each of the gate spacers GS. The gate capping pattern GP may be formed of or include at least one of SiON, SiCN, SiCON, or SiN.

A first interlayer insulating layer 110 may be provided on the substrate 100. The first interlayer insulating layer 110 may cover side surfaces of the gate spacers GS and top surfaces of the source/drain patterns SD. A top surface of the first interlayer insulating layer 110 may be located at substantially the same level as the top surface of the gate capping pattern GP and the top surfaces of the gate spacers GS. A second interlayer insulating layer 120 may be provided on the first interlayer insulating layer 110 to cover the top surface of the gate capping pattern GP and the top surfaces of the gate spacers GS. In an embodiment, the first and second interlayer insulating layers 110 and 120 may be formed of or include silicon oxide.

Active contacts AC may be provided to penetrate the first and second interlayer insulating layers 110 and 120 and to be electrically connected to the source/drain patterns SD. The gate electrode GE may be provided between a pair of the active contacts AC. When viewed in the plan view of FIG. 4, each of the active contacts AC may be a bar-shaped pattern extending in the second direction Y.

The active contacts AC of the semiconductor device may be an example of the conductive patterns CP described with reference to FIGS. 1 and 2. A density of the "active contacts AC" may vary depending on a position of a cell region, and a density of "dummy active contacts" in the dummy region gradually changes between the cell regions. The dummy active contacts in some embodiments may be electrically isolated from other conductive components.

Each of the active contacts AC may include a conductive pattern FM and a barrier pattern BM, which is provided to enclose the conductive pattern FM. The conductive pattern FM may be formed of or include at least one of metallic materials (e.g., aluminum, copper, tungsten, molybdenum, and cobalt). The barrier pattern BM may cover side and bottom surfaces of the conductive pattern FM. In an embodiment, the barrier pattern BM may include a metal layer and/or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

The active contacts AC may be self-aligned contacts. For example, the active contacts AC may be formed by a self-alignment process using the gate capping pattern GP and the gate spacers GS.

A silicide pattern SC may be provided between one of the active contacts AC and one of the source/drain patterns SD. Each of the active contacts AC may be electrically connected to a corresponding one of the source/drain patterns SD through the silicide pattern SC. The silicide pattern SC may be formed of or include at least one of metal-silicide materials.

In an embodiment, a gate contact may be provided to penetrate the second interlayer insulating layer 120 and the gate capping pattern GP and to be electrically connected to the gate electrode GE. In an embodiment, the gate contact may be provided on the device isolation layer ST between the active regions AR. The gate contact may include the conductive pattern FM and the barrier pattern BM enclosing the conductive pattern FM, similar to the active contacts AC.

A third interlayer insulating layer 130 may be provided on the second interlayer insulating layer 120. First interconnection lines M1 and a first via V1 may be provided in the third interlayer insulating layer 130. The first via V1 may be provided below one of the first interconnection lines M1. Each of the first interconnection lines M1 may be extended in the first direction X. The first interconnection lines M1 may be arranged in the first or second direction X or Y. The first via V1 may be provided between one of the first interconnection lines M1 and one of the active contacts AC to electrically connect them to each other. In an embodiment, a second via may be provided between one of the first interconnection lines M1 and the gate contact to electrically connect them to each other.

One of the first interconnection lines M1 and the first via V1 may be connected to form a single object, thereby serving as a single conductive structure. For example, the first interconnection lines M1 and the first via V1 may be formed concurrently by the same process. The first interconnection lines M1 and the first via V1 may be parts of a single conductive structure that is formed by a dual damascene process. In an embodiment, other metal layers (e.g., M2, M3, M4, and so forth) may be additionally provided on the third interlayer insulating layer 130.

Figure 7:
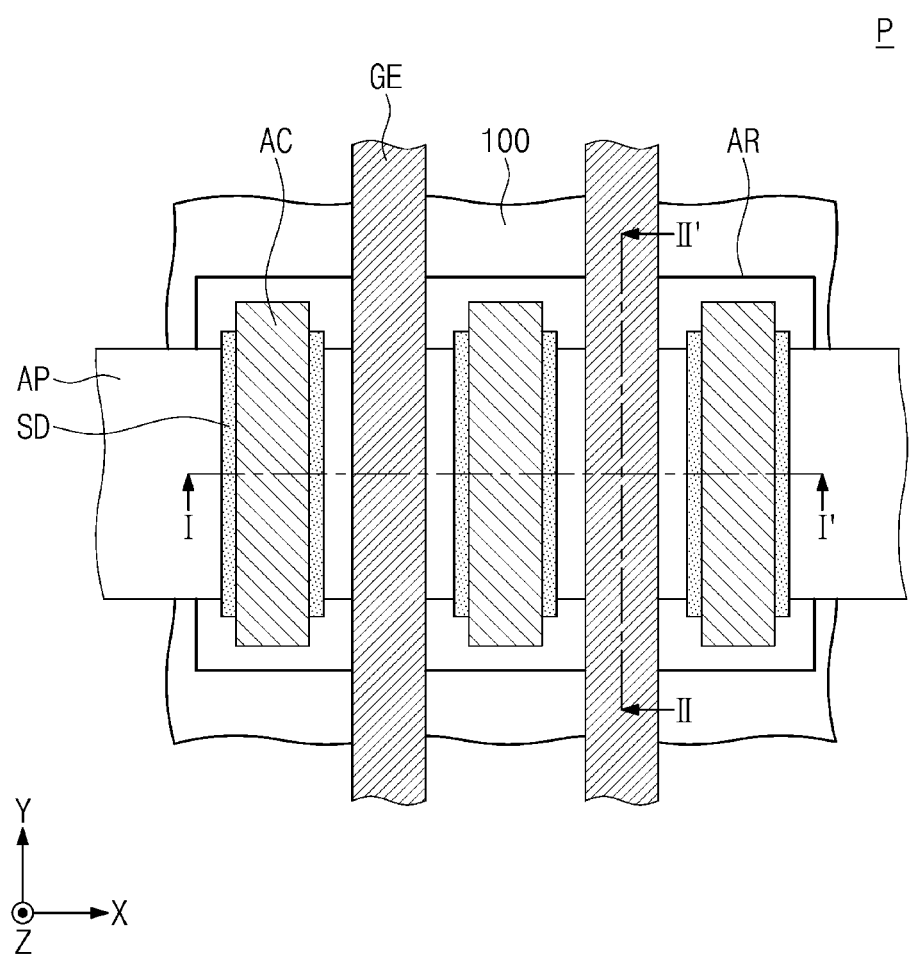
Figure 8:
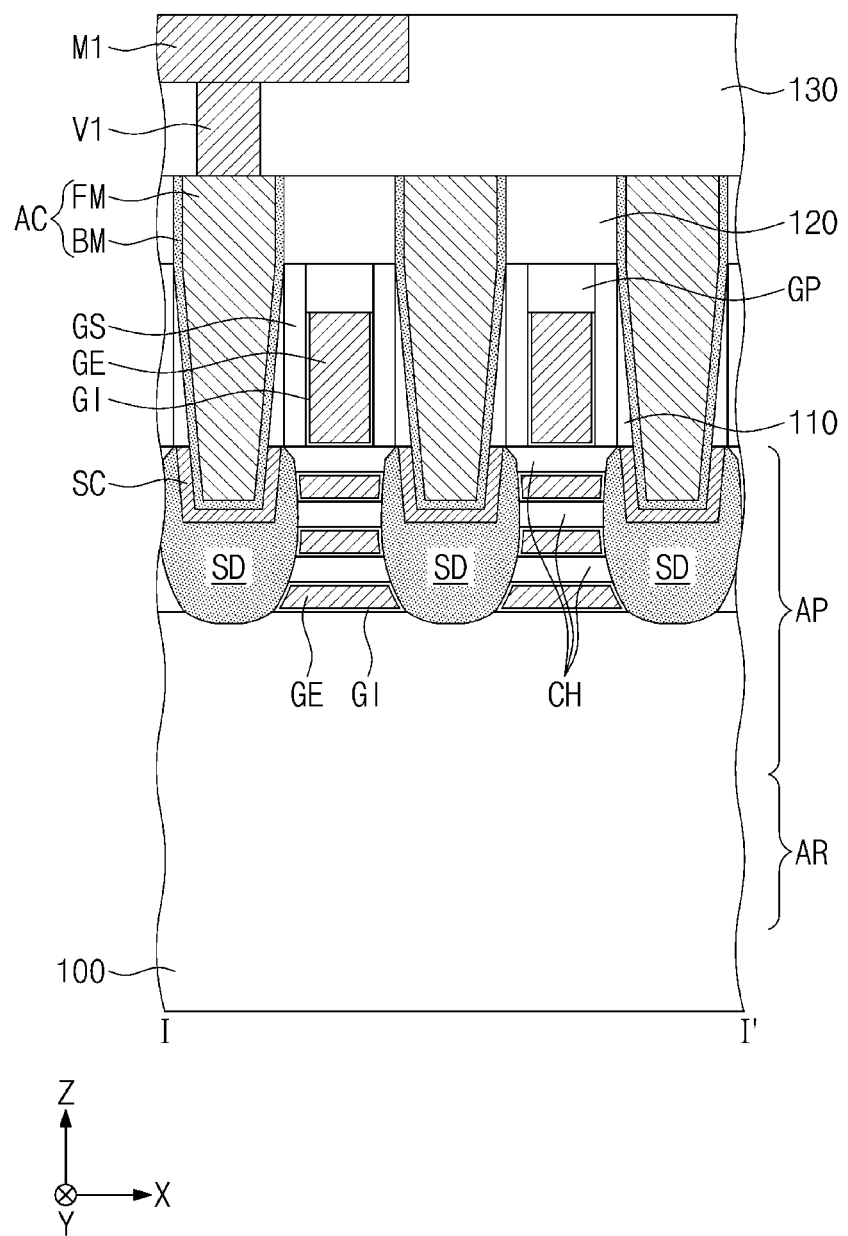
FIGS. 8 and 9 are sectional views, which are respectively taken along lines I-I' and II-II' of FIG. 7 to illustrate a semiconductor device according to an embodiment of the inventive concept.
Figure 9:
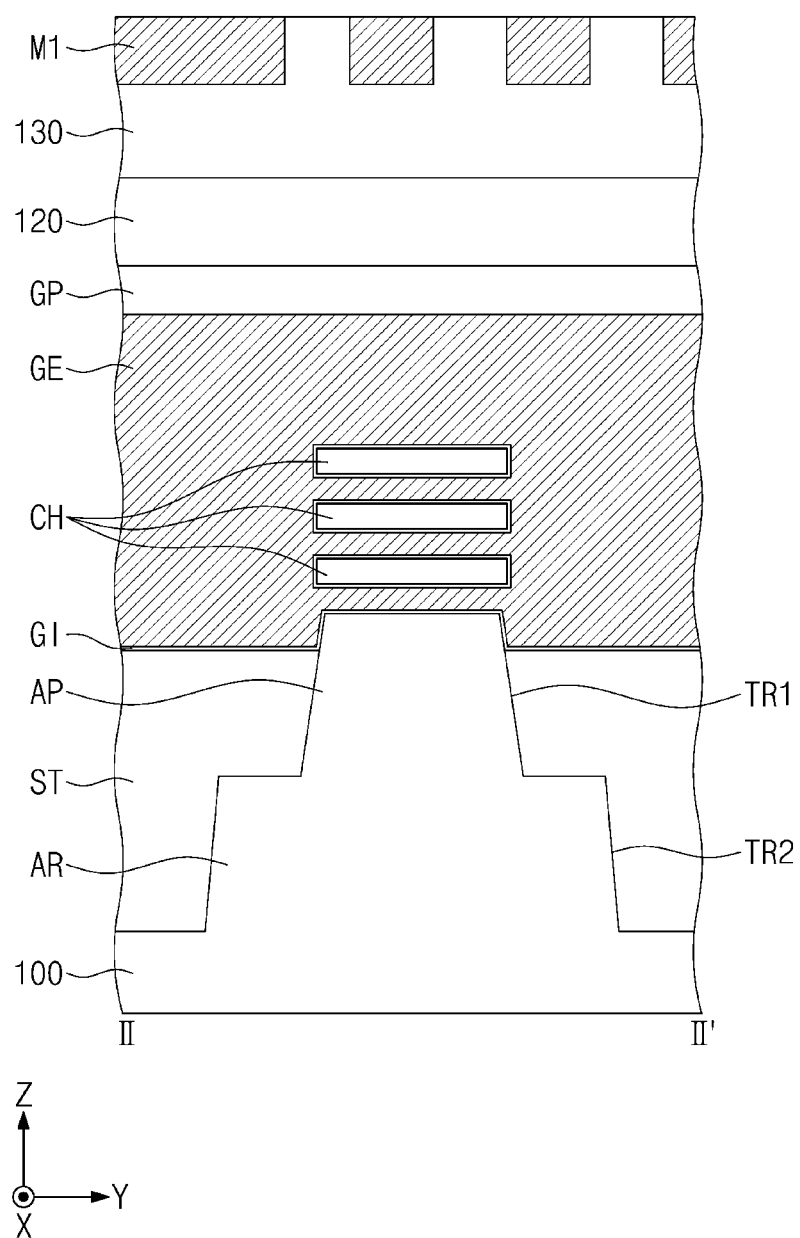

FIG. 7 is a plan view illustrating a semiconductor device according to an embodiment of the inventive concept and corresponding to a portion 'P' of FIG. 1. FIGS. 8 and 9 are sectional views, which are respectively taken along lines I-I' and II-II' of FIG. 7 to illustrate a semiconductor device according to an embodiment of the inventive concept. In the following description, an element previously described with reference to FIGS. 4 to 6 may be identified by the same reference number without repeating an overlapping description thereof, for concise description.

Referring to FIGS. 7, 8, and 9, the active pattern AP may include a plurality of channel layers CH which are stacked. The channel layers CH may be provided in an upper portion of the active pattern AP. The channel layers CH may be spaced apart from each other in the third direction Z. The channel layers CH may be provided between a pair of the source/drain patterns SD. The gate electrode GE may be provided to cover or face top, bottom, and side surfaces of each of the channel layers CH. The gate electrode GE may include a portion that is extended in the second direction Y and is interposed between the channel layers CH. For example, a transistor on the active region AR may be a three-dimensional (e.g., gate-all-around (GAA)) field effect transistor, in which the gate electrode GE is provided to three-dimensionally surround the channel layers CH.

According to an embodiment of the inventive concept, since a pattern density of a dummy region between cell regions gradually changes, it may be possible to prevent or suppress an edge-of-erosion (EOE) phenomenon at a boundary between each of the cell regions and the dummy region and thereby to improve electrical and reliability characteristics of semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a first cell region, a second cell region, and a dummy region between the first and second cell regions, the dummy region comprises a plurality of sub-dummy regions having the same length in a first direction; and
conductive patterns included in the first cell region, the second cell region, and the dummy region,
wherein a first pattern density, which is defined as a density of the conductive patterns of the first cell region, is different from a second pattern density, which is defined as a density of the conductive patterns of the second cell region,
a third pattern density, which is defined as a density of the conductive patterns of the dummy region, is stepwise increased, with respect to each adjacent sub-dummy region, in the first direction from a sub-dummy region adjacent to the first cell region to a sub-dummy region adjacent to the second cell region,
a top surface of the substrate is inclined at an angle, in the dummy region,
a density of the conductive patterns of the sub-dummy region adjacent to the second cell region is higher than a density of the conductive patterns of the sub-dummy region adjacent to the first cell region,
the second pattern density is higher than the density of the conductive patterns of the sub-dummy region adjacent to the second cell region, and
the density of the conductive patterns of the sub-dummy region adjacent to the first cell region is higher than the first pattern density.

2. The semiconductor device of claim 1, wherein a height of the substrate gradually changes between the first cell region and the second cell region.

3. The semiconductor device of claim 2, wherein the second pattern density is higher than the first pattern density, and
a height of the dummy region decreases as a distance to the second cell region decreases.

4. The semiconductor device of claim 1, wherein the second pattern density is higher than the first pattern density, and
the sub-dummy regions have the same area.

5. The semiconductor device of claim 4, wherein, in each of the sub-dummy regions, the conductive patterns are arranged to be symmetric about a diagonal of a top surface of each of the sub-dummy regions.

6. The semiconductor device of claim 4, wherein a change rate of pattern density, which is defined as a difference in pattern density between adjacent ones of the sub-dummy regions, is given as follows:

$$R12=(d2-d1)/(Ld/Ls+1),$$

where R12 is a change rate of the pattern density between the first cell region and the second cell region, d1 is the first pattern density, d2 is the second pattern density, Ld is a length of the dummy region, and Ls is a length of each of the sub-dummy regions.

7. A semiconductor device, comprising:
a substrate; and
conductive patterns,
wherein the substrate comprises a plurality of cell regions having different conductive pattern densities and a dummy region between the cell regions, the dummy region comprises a plurality of sub-dummy regions having the same length in a first direction,
a conductive pattern density of the dummy region gradually is stepwise increased, with respect to each adjacent sub-dummy region, in the first direction from a sub-dummy region adjacent to a first cell region included in the plurality of cell regions to a sub-dummy region adjacent to a second cell region included in the plurality of cell regions,
a height of the substrate gradually changes in the dummy region,
a conductive pattern density of the sub-dummy region adjacent to the second cell region is higher than a conductive pattern density of the sub-dummy region adjacent to the first cell region, a conductive pattern density of the second cell region is higher than the conductive pattern density of the sub-dummy region adjacent to the second cell region, and the conductive pattern density of the sub-dummy region adjacent to the first cell region is higher than a conductive pattern density of the cell region.

8. The semiconductor device of claim 7, wherein the second cell region is spaced apart from the first cell region in the first direction;
a third cell region, included in the plurality of cell regions, is spaced apart from the first cell region in a second direction crossing the first direction; and
a fourth cell region, included in the plurality of cell regions, is spaced apart from the second cell region in the second direction and spaced apart from the third cell region in the first direction.

9. The semiconductor device of claim 8, wherein
the sub-dummy regions have the same area.

10. The semiconductor device of claim 9, wherein change rates of conductive pattern density, which are defined as differences in conductive pattern density between adjacent ones of the sub-dummy regions, are given as follows:

$$Rij=(dj-di)/(n+1)(i,j=1, 2, 3 \text{ or } 4, i \neq j),$$

where Rij is a change rate of conductive pattern density between i-th and j-th cell regions, di is a pattern density of the i-th cell region, and n is the number of the sub-dummy regions placed between two adjacent ones of the first to fourth cell regions.

11. The semiconductor device of claim 10, wherein a conductive pattern density of at least one of the sub-dummy regions is determined by at least two of the change rates of the conductive pattern density.

12. The semiconductor device of claim 9, wherein, in each of the sub-dummy regions, the conductive patterns are arranged to be symmetric about a diagonal of a top surface of each of the sub-dummy regions.

13. A semiconductor device, comprising:
an active pattern extended in a first direction, on a substrate including a first cell region, a second cell region, and a dummy region between the first and second cell regions, the dummy region comprises a plurality of sub-dummy regions having the same length in the first direction;
a pair of source/drain patterns provided on the active pattern and spaced apart from each other in the first direction;
a gate electrode provided between the source/drain patterns and extended in a second direction to cross the active pattern, the second direction crossing the first direction;
an interlayer insulating layer covering the source/drain patterns and the gate electrode; and
active contacts provided to penetrate the interlayer insulating layer and connect to the source/drain patterns, respectively, wherein a first density, which is defined as a density of the active contacts of the first cell region, is different from a second density, which is defined as a density of the active contacts of the second cell region,
a third density, which is defined as a density of the active contacts of the dummy region, is stepwise increased, with respect to each adjacent sub-dummy region, in the first direction from a sub-dummy region adjacent to the first cell region to a sub-dummy region adjacent to the second cell region,
a top surface of the substrate is inclined at an angle, in the dummy region,
a density of the active contacts of the sub-dummy region adjacent to the second cell region is higher than a density of the active contacts of the sub-dummy region adjacent to the first cell region,
the second density is higher than the density of the active contacts of the sub-dummy region adjacent to the second cell region, and
the density of the active contacts of the sub-dummy region adjacent to the first cell region is higher than the first density.

14. The semiconductor device of claim 13, wherein a height of the substrate gradually changes between the first cell region and the second cell region.

15. The semiconductor device of claim 14, wherein the second density is higher than the first density, and
a height of the dummy region decreases as a distance to the second cell region decreases.

16. The semiconductor device of claim 13, wherein
the sub-dummy regions have the same area.

17. The semiconductor device of claim 16, wherein, in each of the sub-dummy regions, the active contacts are arranged to be symmetric about a diagonal of a top surface of each of the sub-dummy regions.

18. The semiconductor device of claim 13, wherein the substrate further comprises a third cell region and a fourth cell region, which are spaced apart from the first cell region and the second cell region in the second direction.

19. The semiconductor device of claim 13, wherein the active pattern is provided in plural, and
each of the active patterns has an upper portion which protrudes vertically and has a fin shape.

20. The semiconductor device of claim 13, wherein the active pattern comprises a plurality of channel layers, which are stacked to be vertically spaced apart from each other, and
the gate electrode is provided to cover top, bottom, and side surfaces of each of the channel layers.

* * * * *